(12) United States Patent
Shimizu

(10) Patent No.: US 11,088,164 B2
(45) Date of Patent: Aug. 10, 2021

(54) SEMICONDUCTOR MEMORY DEVICE

(71) Applicant: Toshiba Memory Corporation, Minato-ku (JP)

(72) Inventor: Kojiro Shimizu, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 48 days.

(21) Appl. No.: 16/557,522

(22) Filed: Aug. 30, 2019

(65) Prior Publication Data

US 2020/0273879 A1    Aug. 27, 2020

(30) Foreign Application Priority Data

Feb. 26, 2019    (JP) .............................. JP2019-032866

(51) Int. Cl.
| | | |
|---|---|---|
| *H01L 27/115* | (2017.01) | |
| *H01L 23/52* | (2006.01) | |
| *H01L 27/11582* | (2017.01) | |
| *H01L 23/528* | (2006.01) | |
| *H01L 27/11565* | (2017.01) | |
| *H01L 21/027* | (2006.01) | |
| *H01L 21/311* | (2006.01) | |
| *H01L 21/768* | (2006.01) | |
| *H01L 21/3105* | (2006.01) | |

(52) U.S. Cl.
CPC ...... *H01L 27/11582* (2013.01); *H01L 23/528* (2013.01); *H01L 21/0274* (2013.01); *H01L 21/31053* (2013.01); *H01L 21/31111* (2013.01); *H01L 21/31144* (2013.01); *H01L 21/76802* (2013.01); *H01L 21/76877* (2013.01); *H01L 27/11565* (2013.01)

(58) Field of Classification Search
CPC ....... H01L 23/52; H01L 23/528; H01L 27/11; H01L 27/115; H01L 27/11575; H01L 27/11582
USPC ......................................................... 257/324
See application file for complete search history.

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2016/0190147 A1 | 6/2016 | Kato et al. |
| 2017/0213845 A1 | 7/2017 | Baba |
| 2017/0263558 A1* | 9/2017 | Shingu .............. H01L 21/76816 |
| 2017/0263638 A1* | 9/2017 | Okada ................. H01L 27/1157 |
| 2018/0090507 A1 | 3/2018 | Ichinose |

(Continued)

*Primary Examiner* — Fazli Erdem
(74) *Attorney, Agent, or Firm* — Oblon, McClelland, Maier & Neustadt, L.L.P.

(57) ABSTRACT

According to one embodiment, a semiconductor memory device includes: first interconnect layers; a second interconnect layer separate from the first interconnect layers; a third interconnect layer separate from the first interconnect layers and adjacent to the second interconnect layer in a second direction; a first memory pillar which passes through the second interconnect layer; a second memory pillar which passes through the third interconnect layer. The second interconnect layer includes a first portion connected to a first contact plug. The third interconnect layer includes a second portion connected to a second contact plug. The first and second portions are arranged along a third direction which intersects the second direction.

20 Claims, 14 Drawing Sheets

(56) References Cited

U.S. PATENT DOCUMENTS

| | | |
|---|---|---|
| 2018/0261608 A1 | 9/2018 | Matsuura et al. |
| 2018/0268902 A1 | 9/2018 | Tanaka |
| 2019/0198523 A1* | 6/2019 | Nakanishi ......... H01L 27/11519 |
| 2019/0287995 A1* | 9/2019 | Oike ................. H01L 27/11519 |
| 2020/0043942 A1* | 2/2020 | Shimojo ............. H01L 23/5283 |

* cited by examiner

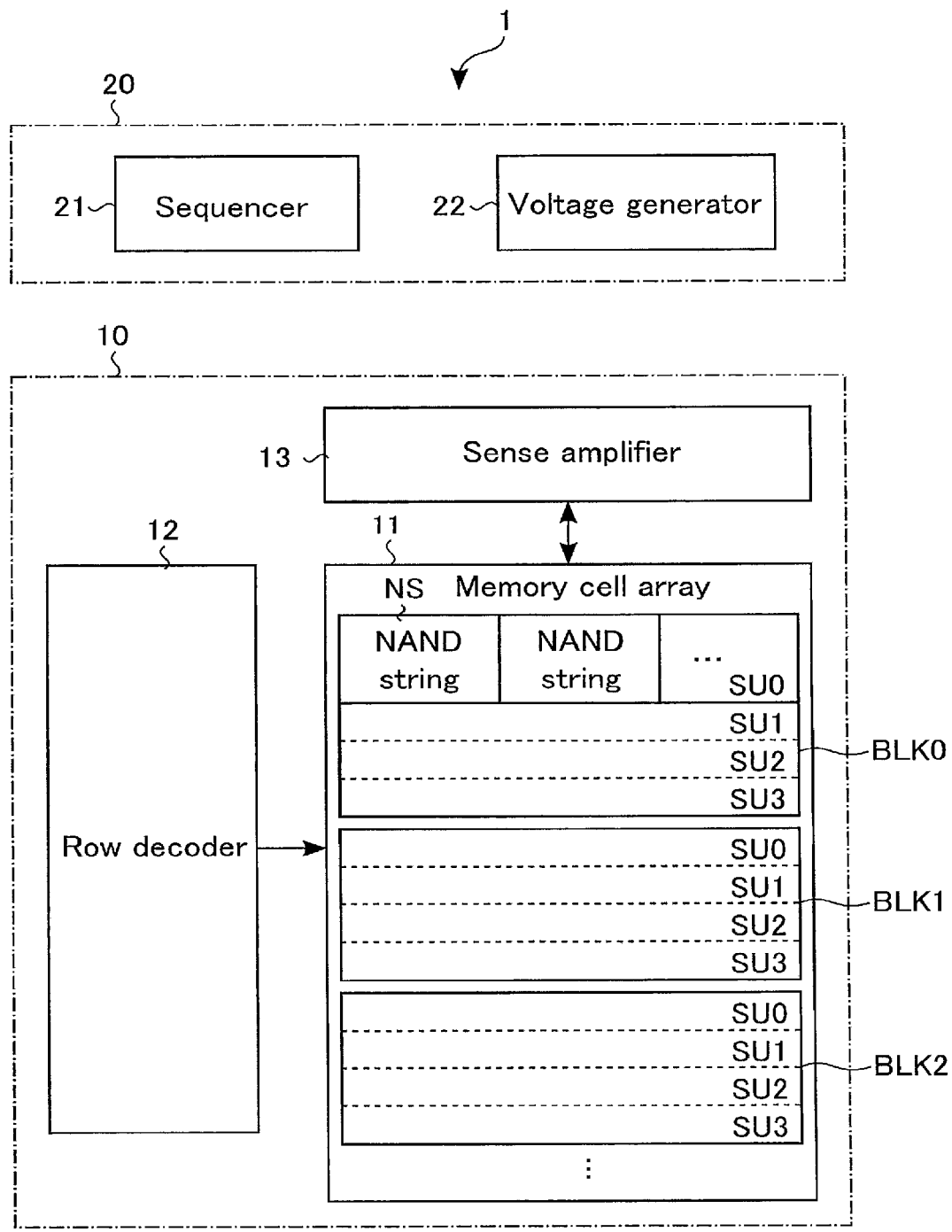
F I G. 1

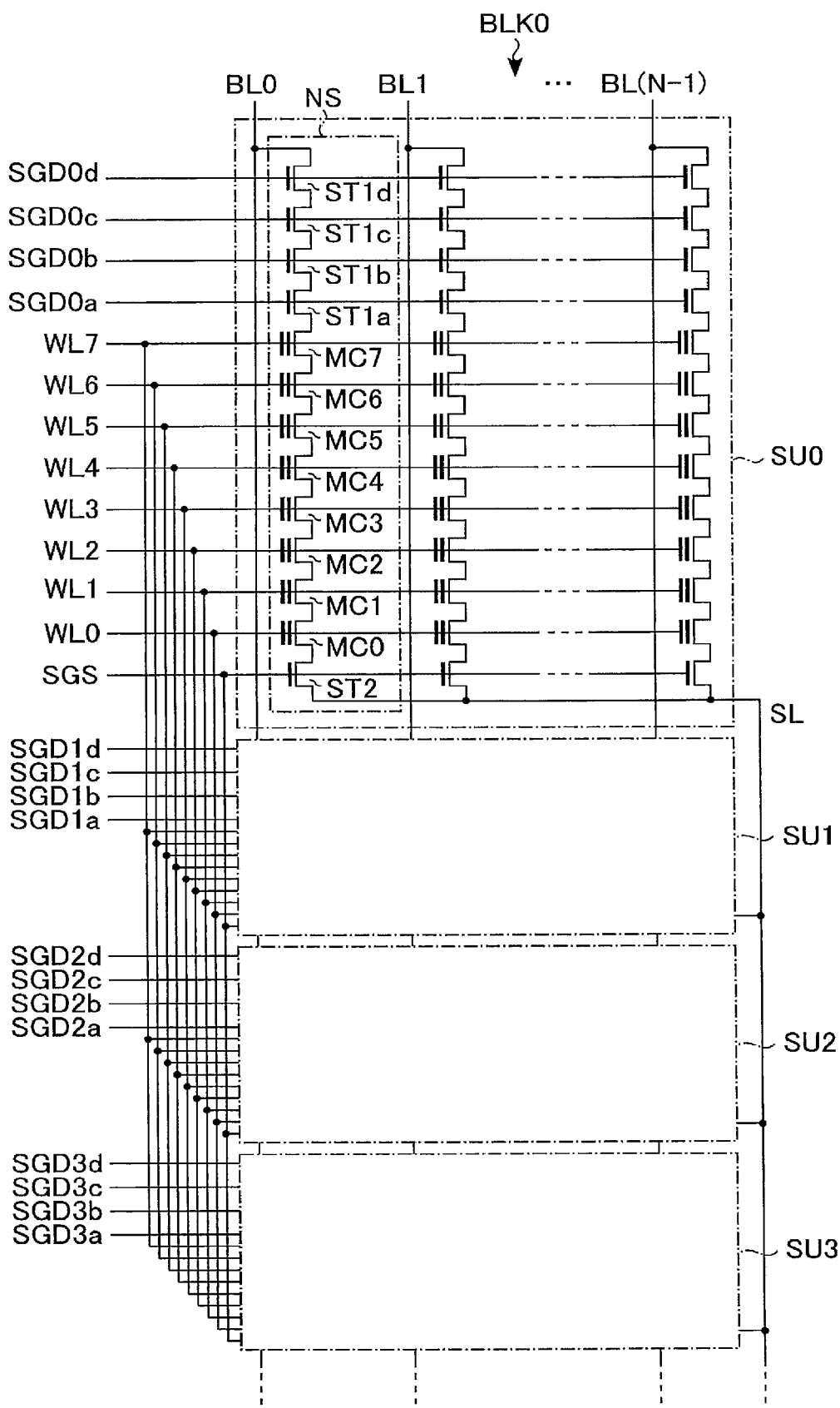
F I G. 2

SEMICONDUCTOR MEMORY DEVICE

CROSS-REFERENCE TO RELATED APPLICATIONS

This application is based upon and claims the benefit of priority from Japanese Patent Application No. 2019-032866, filed Feb. 26, 2019, the entire contents of which are incorporated herein by reference.

FIELD

Embodiments described herein relate generally to a semiconductor memory device.

BACKGROUND

A NAND flash memory has been known as a semiconductor memory device.

BRIEF DESCRIPTION OF THE DRAWINGS

FIG. 1 is a block diagram of a semiconductor memory device according to a first embodiment;

FIG. 2 is a circuit diagram of a memory cell array included in the semiconductor memory device according to the first embodiment;

DETAILED DESCRIPTION

Figure 3:
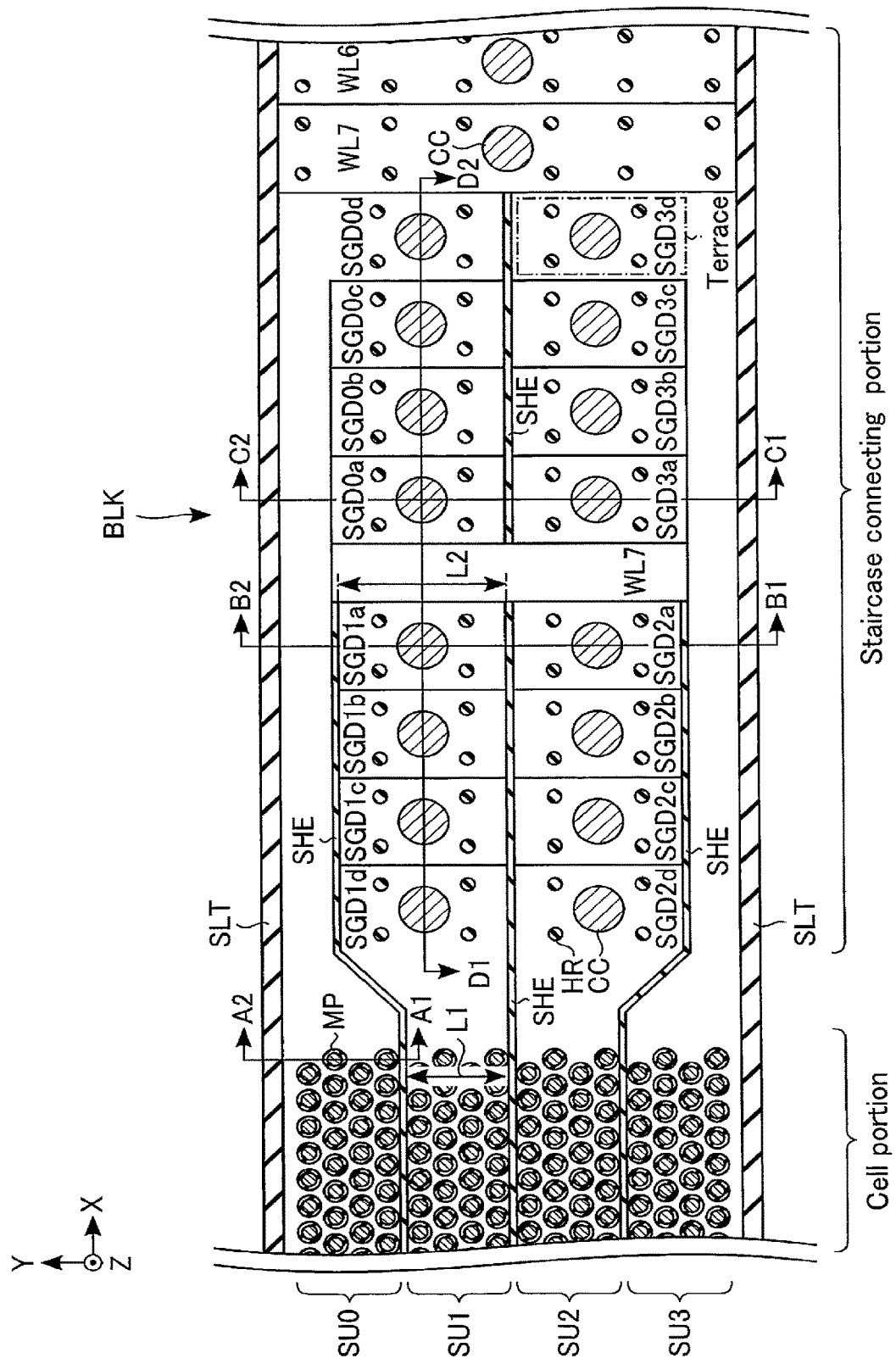
FIG. 3 is a plan view of the memory cell array included in the semiconductor memory device according to the first embodiment.

In general, according to one embodiment, a semiconductor memory device includes: a plurality of first interconnect layers above a substrate at intervals in a first direction; a second interconnect layer above the first interconnect layers, the second interconnect layer being separate from the first interconnect layers; a third interconnect layer above the first interconnect layers, the third interconnect layer being separate from the first interconnect layers and adjacent to the second interconnect layer in a second direction which is parallel to the substrate and intersects the first direction; a first memory pillar which passes through the first interconnect layers and the second interconnect layer and extends in the first direction; a second memory pillar which passes through the first interconnect layers and the third interconnect layer and extends in the first direction; a first contact plug on the second interconnect layer; and a second contact plug on the third interconnect layer. The second interconnect layer includes a first portion connected to the first contact plug. The third interconnect layer includes a second portion connected to the second contact plug. The first portion and the second portion are arranged along a third direction which intersects the first and second directions.

1. First Embodiment

A semiconductor memory device according to the first embodiment is described. In the following description, a memory cell transistors are three-dimensionally stacked on a semiconductor substrate is discussed as an exemplary semiconductor memory device.

1.1 Configuration 1.1.1 Overall Configuration of Semiconductor Memory Device

First, an overall configuration of the semiconductor memory device will be described with reference to FIG. 1. FIG. 1 is an example of a block diagram illustrating a basic overall configuration of the semiconductor memory device.

As illustrated in FIG. 1, a semiconductor memory device 1 includes a memory core region 10 and a peripheral circuit region 20.

The memory core region 10 includes a memory cell array 11, a row decoder 12, and a sense amplifier 13.

The memory cell array 11 includes a plurality of blocks BLK (BLK0, BLK1, BLK2, and so on). Each of the blocks BLK includes a plurality of (four in the present embodiment) string units SU (SU0 to SU3) each of which is a set of NAND strings NS each having memory cell transistors coupled in series. Incidentally, The memory cell array 11 may contain any number of blocks BLK, and a block BLK may contain any number of string units SU.

The row decoder 12 decodes a row address received from an external controller (not illustrated). Further, the row decoder 12 selects a row of the memory cell array 11 based on the decoding result. More specifically, the row decoder 12 applies voltages to various interconnects configured to select a row.

The sense amplifier 13 senses data read from one of the blocks BLK during reading of data. In addition, the sense amplifier 13 applies voltages corresponding to write data to the memory cell array 11 during writing of data.

The peripheral circuit region 20 includes a sequencer 21 and a voltage generator 22.

The sequencer 21 controls an overall operation of the semiconductor memory device 1. More specifically, the sequencer 21 controls the voltage generator 22, the row decoder 12, the sense amplifier 13, and the like during a write operation, a read operation, and an erase operation.

The voltage generator 22 generates voltages to be used for the write operation, the read operation, and the erase operation, and supplies the voltages to the row decoder 12, the sense amplifier 13, and the like.

1.1.2 Configuration of Memory Cell Array

Next, a configuration of the memory cell array 11 will be described with reference to FIG. 2. An example of FIG. 2 illustrates the block BLK0, but the other blocks BLK have the same configuration.

As illustrated in FIG. 2, the block BLK0 includes, for example, the four string units SU0 to SU3. Each of the string units SU includes the plurality of NAND strings NS. Each of the NAND strings NS includes, for example, eight memory cell transistors MC (MC0 to MC7), four select transistors ST1 (ST1a to ST1d), and a select transistor ST2. A memory cell transistor MC includes a control gate and a charge storage layer, and stores data in a non-volatile manner. Hereinafter, when none of the memory cell transistors MC0 to MC7 needs to be specified, each of them will be referred to as a memory cell transistor MC. When none of the select transistors ST1a to ST1d needs to be specified, each of them will be referred to as a select transistor ST1.

Incidentally, the memory cell transistor MC may be of a MONOS type using an insulating film as the charge storage layer, or may be of an FG type using a conductive layer as the charge storage layer. Hereinafter, the MONOS type will be described as an example in the present embodiment. In addition, the number of the memory cell transistors MC is not limited to eight, and may be 16, 32, 64, 96, 128, and the like, and these numbers are not limitations. Although the example of FIG. 2 illustrates a case where there are four select transistors ST1 and one select transistor ST2, it suffices if there is one or more select transistors ST1 or more and one or more select transistors ST2. In the present embodiment, the four select transistors ST1a to ST1d effectively function as one select transistor ST1.

In the NAND string NS, respective current paths are coupled in series in the order of the select transistor ST2, the memory cell transistors MC0 to MC7, and the select transistors ST1a to ST1d. Further, a drain of the select transistor ST1d is coupled to a corresponding bit line BL. In addition, a source of the select transistor ST2 is coupled to a source line SL.

Control gates of the memory cell transistors MC0 to MC7 of the NAND strings NS in the same block BLK are commonly coupled to different word lines WL0 to WL7. More specifically, for example, the control gates of a plurality of the memory cell transistors MC0 in the block BLK0 are commonly coupled to the word line WL0.

Gates of the select transistors ST1a to ST1d of the NAND strings NS in the same string unit SU are coupled to the same select gate lines SGDa to SGDd, respectively. More specifically, the gates of the select transistors ST1a to ST1d in the string unit SU0 are coupled to select gate lines SGD0a to SGD0d, respectively. The gates of the select transistors ST1a to ST1d (not illustrated) in the string unit SU1 are coupled to select gate lines SGD1a to SGD0d, respectively. The gates of the select transistors ST1a to ST1d (not illustrated) in the string unit SU2 are coupled to select gate lines SGD2a to SGD2d, respectively. The gates of the select transistors ST1a to ST1d (not illustrated) in the string unit SU3 are coupled to select gate lines SGD3a to SGD3d, respectively. Hereinafter, when none of the select gate lines SGD0a to SGD3a needs to be specified, each of them will be referred to as a select gate line SGDa. Similarly, when none of the select gate lines SGD0b to SGD3b needs to be specified, each of them will be referred to as a select gate line SGDb. When none of the select gate lines SGD0c to SGD3c need to be specified, each of them will be referred to as a select gate line SGDc. When none of the select gate lines SGD0d to SGD3d needs to be specified, each of them will be referred to as a select gate line SGDd. Furthermore, when none of the select gate lines SGDa to SGDd needs to be specified, each of them will be referred to as a select gate line SGD.

Gates of the select transistors ST2 in the same block BLK are commonly coupled to a select gate line SGS. Incidentally, the gates of the select transistors ST2 in the string units SU0 to SU3 may be coupled to different select gate lines SGS for different string units SU.

The drains of the plurality of select transistors ST1d in a string unit SU are coupled to different bit lines BL (BL0 to BL(N−1), where N is a natural number larger than or equal to two). That is, the plurality of NAND strings NS in a string unit SU are coupled to the different bit lines BL. In addition, a bit line BL commonly couples NAND strings NS respectively included in the string units SU0 to SU3 of each block BLK.

The sources of the select transistors ST2 in the blocks BLK are commonly coupled to the source line SL.

That is, a string unit SU is a set of NAND strings NS which are coupled to different bit lines BL and coupled to the same select gate lines SGD (SGDa to SGDd). In addition, a block BLK is a set of a plurality of string units SU sharing the word lines WL. A memory cell array 11 is a set of a plurality of blocks BLK sharing the bit lines BL.

Incidentally, the memory cell array 11 may have a configuration other than the above. That is, a configuration of the memory cell array 11 is described, for example, in U.S. patent application Ser. No. 12/407,403, filed on Mar. 19, 2009, entitled "THREE DIMENSIONAL STACKED NON-VOLATILE SEMICONDUCTOR MEMORY". In addition, it is described in U.S. patent application Ser. No. 12/406,524 filed on Mar. 18, 2009, entitled "THREE DIMENSIONAL STACKED NONVOLATILE SEMICONDUCTOR MEMORY", U.S. patent application Ser. No. 12/679,991, filed on Mar. 25, 2010, entitled "NON-VOLATILE SEMICONDUCTOR STORAGE DEVICE AND METHOD OF MANUFACTURING THE SAME", and U.S. patent application Ser. No. 12/532,030, filed on Mar. 23, 2009, entitled "SEMICONDUCTOR MEMORY AND METHOD FOR MANUFACTURING SAME". The entire contents of these patent applications are incorporated herein by reference.

1.1.3 Planar Configuration of Memory Cell Array

Figure 4:
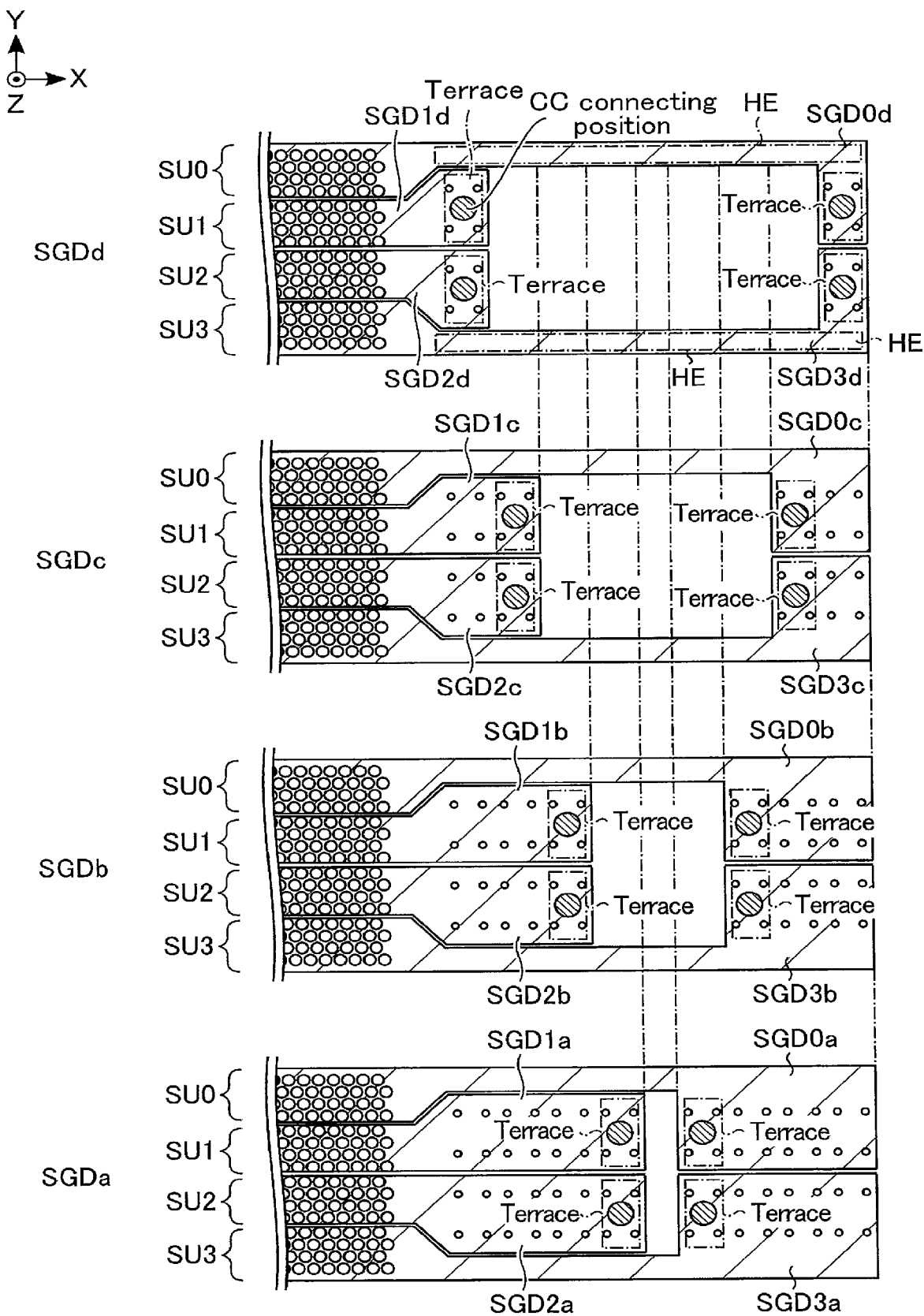
FIG. 4 is a plan view of select gate lines SGD in the memory cell array included in the semiconductor memory device according to the first embodiment.

Next, a planar configuration of the memory cell array 11 will be described with reference to FIGS. 3 and 4. FIG. 3 is a plan view of the string units SU0 to SU3 in one block BLK. Incidentally, an interlayer insulating film is omitted in the example of FIG. 3. FIG. 4 is a plan view of layers of the select gate lines SGDa to SGDd.

As illustrated in FIG. 3, in the present embodiment, the select gate line SGS, the word lines WL0 to WL7, and the select gate lines SGDa to SGDd are stacked from a lower layer in a Z direction perpendicular to the semiconductor substrate. The string units SU0 to SU3 are provided to be adjacent to each other in a Y direction which is parallel to the semiconductor substrate and intersects the Z direction. More specifically, the select gate lines SGDa to SGDd are separated for each of the string units SU by slits SHE. Incidentally, the slits SHE do not separate the word lines WL and the select gate line SGS provided below the select gate lines SGD. That is, the word lines WL and the select gate lines SGS of the string units SU0 to SU3 are shared below the select gate lines SGD. Further, slits SLT are formed on side surfaces facing the Y direction of the string units SU0 and SU3. The slits SLT are provided to separate the select gate lines SGD, the word lines WL, and the select gate line SGS for each of the blocks BLK.

Each of the blocks BLK includes a cell portion and a staircase connecting portion.

In the cell portion, a plurality of memory pillars MP corresponding to the NAND string NS are formed.

Details of a structure of the memory pillar MP will be described later. In the example of FIG. 3, the memory pillars MP are arranged in a staggered arrangement of 16 lines (rows) in an X direction that is parallel to the semiconductor substrate and intersects the Y direction. Further, the select gate lines SGD are separated for each of the string units SU by three slits SHE extending in the X direction such that the memory pillars MP have the staggered arrangement of four lines for each of the string units SU. Incidentally, the memory pillars MP can be arranged in any arrangement. For example, the memory pillars MP may be arranged in a staggered arrangement of 8 lines or a staggered arrangement of 20 lines in the X direction, or sixteen memory pillars may be arranged in a row along the Y direction.

Each of the memory pillars MP passes through the select gate lines SGD, the word lines WL, and the select gate line SGS, and extends in the Z direction. Upper ends of respective memory pillars MP of respective string units SU are commonly coupled by, for example, a bit line BL (not illustrated) extending in the Y direction.

A plurality of contact plugs CC, coupled to the select gate lines SGD and SGS and the word lines WL, are formed in the staircase connecting portion. Each of the select gate lines SGD and SGS and the word line WL is coupled to the row decoder 12 via a contact plug CC.

In the staircase connecting portion, a plurality of interconnect layers corresponding to the select gate lines SGD and SGS and the word lines WL are drawn out in a staircase manner in the X direction. Further, each of the interconnect layers include, at its end portion, a connecting portion to be connected to a contact plug CC. Hereinafter, such a connecting portion will be referred to as a "terrace".

In the present embodiment, a plurality of terraces corresponding to the select gate lines SGD of the two string units SU are arranged along the X direction. That is, a plurality of terraces corresponding to the select gate lines SGD of the four string units SU are arranged in two rows along the X direction. Incidentally, the plurality of terraces corresponding to the select gate lines SGD of the four string units SU may be arranged in one row along the X direction.

More specifically, a plurality of terraces corresponding to the select gate lines SGD1$d$ to SGD1$a$ of the string unit SU1 and a plurality of terraces corresponding to the select gate lines SGD0$a$ to SGD0$d$ of the string unit SU0 are arranged in a row in the X direction from the cell portion to the staircase connecting portion.

A length in the Y direction of the string unit SU1 in the cell portion is denoted by L1, and a length in the Y direction of the terrace of the string unit SU1 is denoted by L2. Then, the slit SHE separating the select gate lines SGD of the string unit SU0 and the select gate lines SGD of the string unit SU1 has a shape bent toward the string unit SU0 side in an XY plane such that the length L2 is longer than the length L1, or a crank shape. The slit SHE separating the select gate lines SGD of the string unit SU0 and the select gate lines SGD of the string unit SU1 extends in a direction that is parallel to the semiconductor substrate and intersects the X direction and the Y direction (the direction oblique to the X direction and the Y direction) in a portion bent toward the string unit SU0 side.

Similarly, a plurality of terraces corresponding to the select gate lines SGD2$d$ to SGD2$a$ of the string unit SU2 and a plurality of terraces corresponding to the select gate lines SGD3$a$ to SGD3$d$ of the string unit SU3 are arranged in a row in the X direction from the cell portion to the staircase connecting portion.

The slit SHE separating the select gate lines SGD of the string unit SU2 and the select gate lines SGD of the string unit SU3 is provided along the X direction. The slit SHE separating the select gate lines SGD of the string unit SU2 and the select gate lines SGD of the string unit SU3 has a crank shape bent toward the string unit SU3 in the XY plane such that a length in the Y direction of the terrace of the string unit SU2 is longer than a length in the Y direction of the string unit SU2 in the cell portion. The slit SHE separating the select gate lines SGD of the string unit SU2 and the select gate lines SGD of the string unit SU3 extends in a direction that is parallel to the semiconductor substrate and intersects the X direction and the Y direction (the direction oblique to the X direction and the Y direction) in a portion bent toward the string unit SU3 side.

Incidentally, the slit SHE separating the select gate lines SGD of the string unit SU1 and the select gate lines SGD of the string unit SU2 extends straight along the X direction without bending from the cell portion to the staircase connecting portion. In addition, terraces corresponding to the word lines WL7 to WL0 are arranged, for example, in a row in the X direction from the cell portion to the staircase connecting portion.

Similar to such a terrace arrangement, the plurality of contact plugs CC respectively corresponding to the select gate lines SGDa to SGDd of the four string units SU0 to SU3 are arranged in two rows along the X direction.

In addition, a plurality of dummy pillars HR, which penetrate through a plurality of interconnect layers corresponding to the select gate lines SGD and SGS and the word lines WL, are provided in the staircase connecting portion. More specifically, for example, the dummy pillars HR provided in the terrace corresponding to the select gate lines SGDd pass through the select gate lines SGDa to SGDd and SGS and the word lines WL0 to WL7. For example, the dummy pillars HR provided in the terrace corresponding to the select gate line SGDa pass through the select gate line SGDa and SGS and the word lines WL0 to WL7. For example, the dummy pillars HR provided in the terrace corresponding to the word line WL7 penetrates the select gate line SGS and the word lines WL0 to WL7. Incidentally, the dummy pillars HR can be arranged in any manner. The dummy pillars HR are not electrically coupled to any interconnect layer. Examples of a method of forming the select gate lines SGD and SGS and the word lines WL include a method of forming a structure corresponding to each interconnect layer with a sacrificial layer, and then, replacing the sacrificial layer with a conductive material to form the interconnect layer (hereinafter referred to as "replacement"). In the replacement, the sacrificial layer is removed to form a void, and then, the void is filled with a conductive material. Thus, the dummy pillars HR function as pillars supporting an interlayer insulating film having a void.

Next, details of a planar configuration of each layer of the select gate lines SGDa to SGDd will be described.

As illustrated in FIG. 4, when first focusing on the select gate line SGDd, the select gate lines SGD0$d$ to SGD3$d$ are separated from each other by the plurality of slits SHE. The terraces of the select gate lines SGD1$d$ and SGD2$d$ are arranged along the Y direction. Similarly, the terraces of the select gate lines SGD0$d$ and SGD3$d$ are arranged along the Y direction. In addition, the terraces of the select gate lines SGD1$d$ and SGD0$d$ are arranged along the X direction. Similarly, the terraces of the select gate lines SGD2$d$ and SGD3$d$ are arranged along the X direction. The contact plug CC is connected to each terrace (reference sign "CC connecting position" in FIG. 4).

Each of the select gate lines SGD0$d$ and SGD3$d$ includes an extraction electrode HE extending in the X direction in the staircase connecting portion. The extraction electrode HE functions as an electrode to draw out the terrace in the X direction (the right side in the drawing of FIG. 4) away from the cell portion. For example, in the string unit SU0, a length in the Y direction of the extraction electrode HE is shorter than a length in the Y direction of the select gate line SGD0*d* in the cell portion. The terraces of the select gate lines SGD0*d* and SGD3*d* are arranged at positions farther from the cell portion than the terraces of the select gate lines SGD1*d* and SGD2*d*.

Next, when focusing on the select gate line SGDc, the select gate lines SGD0*c* to SGD3*c* are separated from each other by the slits SHE. The terraces of the select gate lines SGD1*c* and SGD2*c* are arranged along the Y direction. Similarly, the terraces of the select gate lines SGD0*c* and SGD3*c* are arranged along the Y direction. In addition, the terraces of the select gate lines SGD1*c* and SGD0*c* are arranged along the X direction. Similarly, the terraces of the select gate lines SGD2*c* and SGD3*c* are arranged along the X direction.

The terraces of the select gate lines SGD1*c* and SGD2*c* are arranged at positions farther from the cell portion than the terraces of the select gate lines SGD1*d* and SGD2*d* so as to form a staircase shape with the terraces of the select gate lines SGD1*d* and SGD2*d* provided thereabove. Each of the select gate lines SGD0*c* and SGD3*c* includes the extraction electrode HE. The terraces of the select gate lines SGD0*c* and SGD3*c* are arranged at positions farther from the cell portion than the terraces of the select gate lines SGD1*c* and SGD2*c*. In addition, the terraces of the select gate lines SGD0*c* and SGD3*c* are arranged at positions closer to the cell portion than the terraces of the select gate lines SGD0*d* and SGD3*d* so as to form a staircase shape with the terraces of the select gate lines SGD0*d* and SGD3*d* provided thereabove.

Next, when focusing on the select gate line SGDb, the select gate lines SGD0*b* to SGD3*b* are separated from each other by the slits SHE. The terraces of the select gate lines SGD1*b* and SGD2*b* are arranged along the Y direction. Similarly, the terraces of the select gate lines SGD0*b* and SGD3*b* are arranged along the Y direction. In addition, the terraces of the select gate lines SGD1*b* and SGD0*b* are arranged along the X direction. Similarly, the terraces of the select gate lines SGD2*b* and SGD3*b* are arranged along the X direction.

The terraces of the select gate lines SGD1*b* and SGD2*b* are arranged at positions farther from the cell portion than the terraces of the select gate lines SGD1*c* and SGD2*c* so as to form a staircase shape with the terraces of the select gate lines SGD1*c* and SGD2*c* provided thereabove. Each of the select gate lines SGD0*b* and SGD3*b* includes the extraction electrode HE. The terraces of the select gate lines SGD0*b* and SGD3*b* are arranged at positions farther from the cell portion than the terraces of the select gate lines SGD1*b* and SGD2*b*. In addition, the terraces of the select gate lines SGD0*b* and SGD3*b* are arranged at positions closer to the cell portion than the terraces of the select gate lines SGD0*c* and SGD3*c* so as to form a staircase shape with the terraces of the select gate lines SGD0*c* and SGD3*c* provided thereabove.

Next, when focusing on the select gate line SGDa, the select gate lines SGD0*a* to SGD3*a* are separated from each other by the slits SHE. The terraces of the select gate lines SGD1*a* and SGD2*a* are arranged along the Y direction. Similarly, the terraces of the select gate lines SGD0*a* and SGD3*a* are arranged along the Y direction. In addition, the terraces of the select gate lines SGD1*a* and SGD0*a* are arranged along the X direction. Similarly, the terraces of the select gate lines SGD2*a* and SGD3*a* are arranged along the X direction.

The terraces of the select gate lines SGD1*a* and SGD2*a* are arranged at positions farther from the cell portion than the terraces of the select gate lines SGD1*b* and SGD2*b* so as to form a staircase shape with the terraces of the select gate lines SGD1*b* and SGD2*b* provided thereabove. Each of the select gate lines SGD0*a* and SGD3*a* includes the extraction electrode HE. The terraces of the select gate lines SGD0*a* and SGD3*a* are arranged at positions farther from the cell portion than the terraces of the select gate lines SGD1*a* and SGD2*a*. In addition, the terraces of the select gate lines SGD0*a* and SGD3*a* are arranged at positions closer to the cell portion than the terraces of the select gate lines SGD0*b* and SGD3*b* so as to form a staircase shape with the terraces of the select gate lines SGD0*b* and SGD3*b* provided thereabove.

1.1.4 Cross-Sectional Configuration of Memory Cell Array

Figure 5:
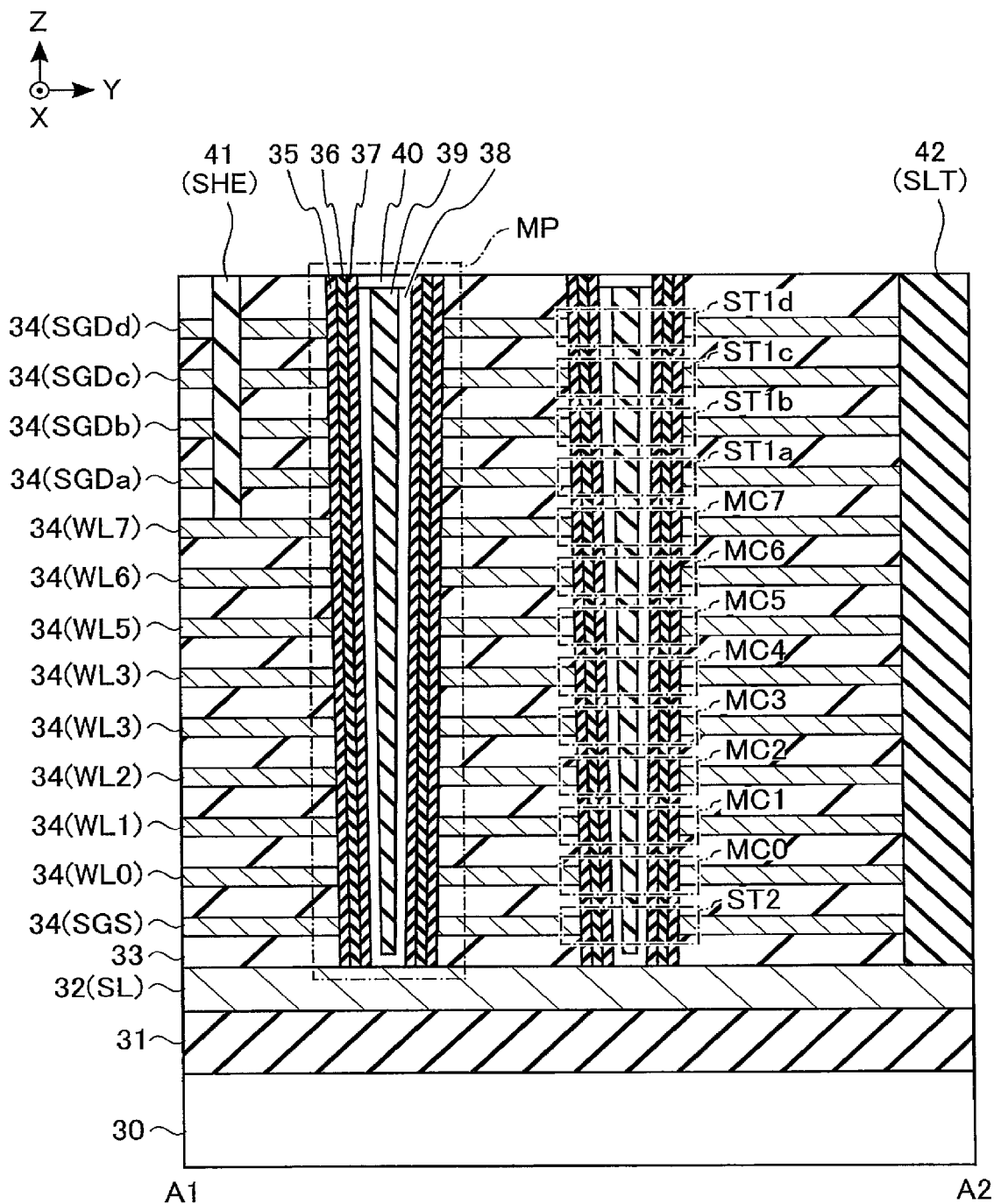
FIG. 5 is a cross-sectional view taken along a line A1-A2 of FIG. 3.
Figure 6:
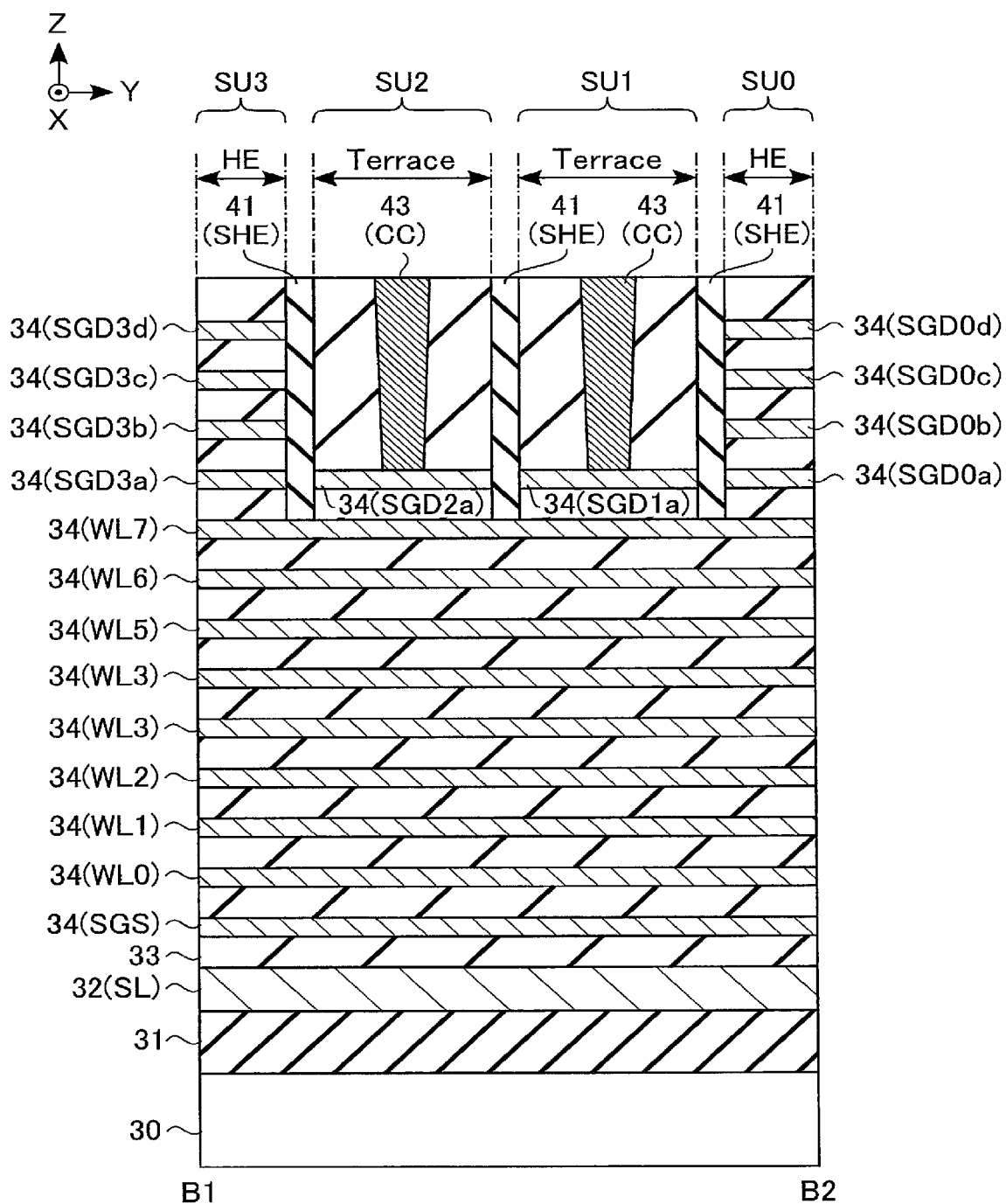
FIG. 6 is a cross-sectional view taken along a line B1-B2 of FIG. 3.
Figure 7:
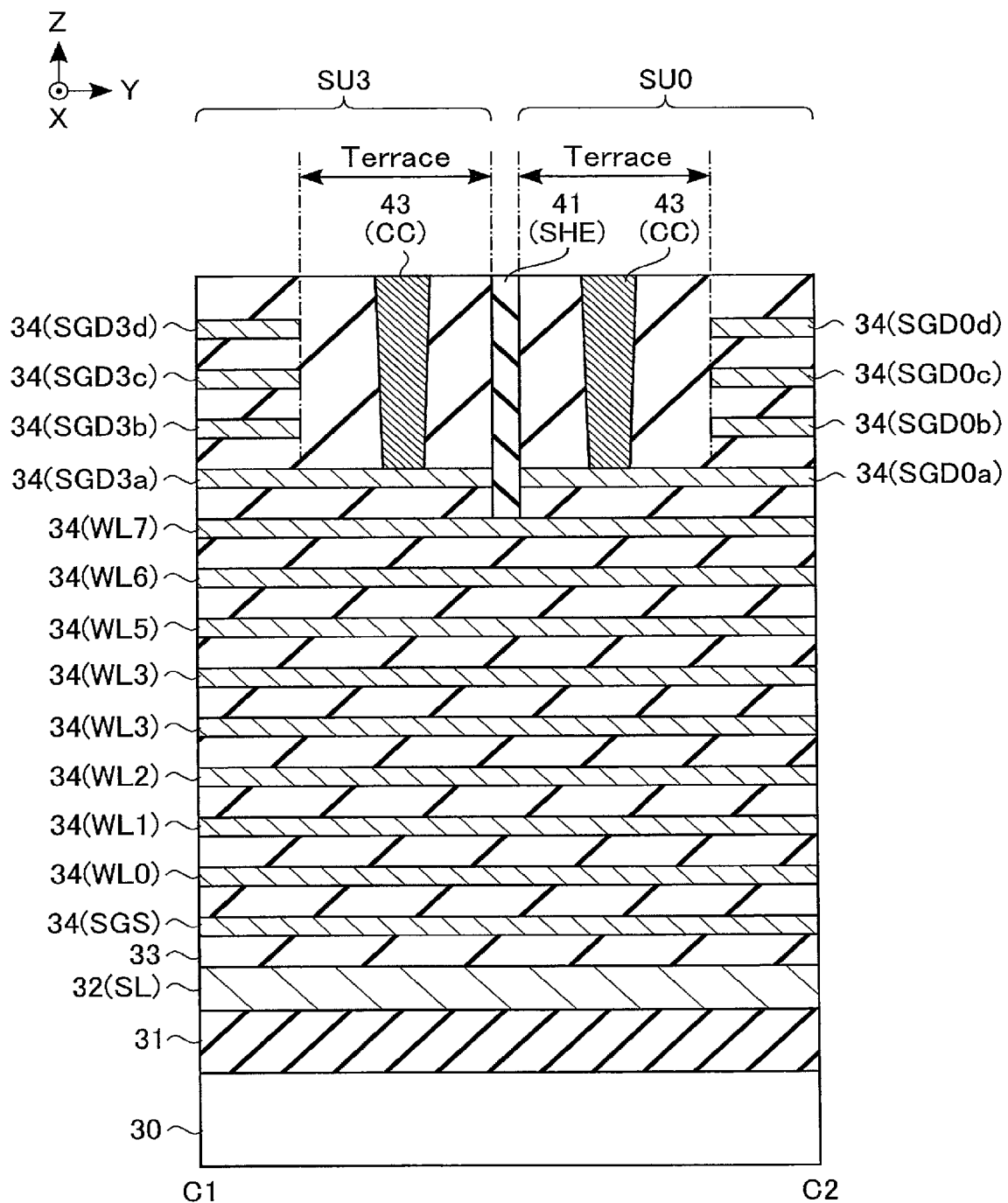
FIG. 7 is a cross-sectional view taken along a line C1-C2 of FIG. 3.
Figure 8:
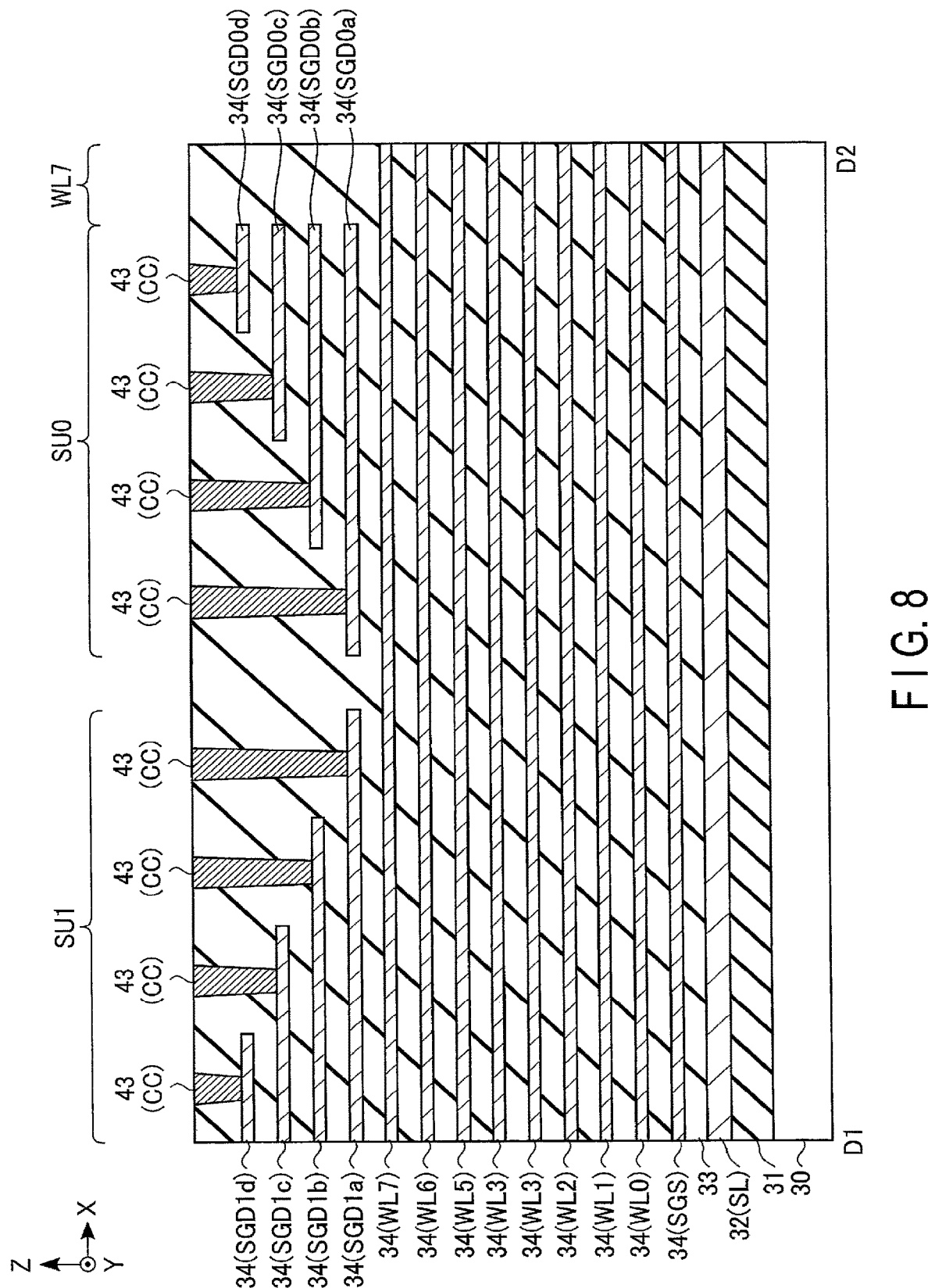
FIG. 8 is a cross-sectional view taken along a line D1-D2 of FIG. 3.

Next, a cross-sectional configuration of the memory cell array 11 will be described with reference to FIGS. 5 to 8. FIG. 5 is a cross-sectional view taken along a line A1-A2 of FIG. 3. FIG. 6 is a cross-sectional view taken along a line B1-B2 of FIG. 3. FIG. 7 is a cross-sectional view taken along a line C1-C2 of FIG. 3. FIG. 8 is a cross-sectional view taken along a line D1-D2 of FIG. 3.

As illustrated in FIG. 5, an insulating layer 31 is formed on a semiconductor substrate 30. For example, a silicon oxide film ($SiO_2$) is used for the insulating layer 31. Incidentally, circuits, such as the row decoder 12 or the sense amplifier 13, may be provided in an area where the insulating layer 31 is formed, that is, between the semiconductor substrate 30 and an interconnect layer 32.

The interconnect layer 32 functioning as the source line SL is formed on the insulating layer 31. The interconnect layer 32 is made of a conductive material, and for example, an n-type semiconductor, a p-type semiconductor, or a metal material is used.

Fourteen insulating layers 33, and thirteen interconnect layers 34 functioning as the select gate lines SGS, the word lines WL0 to WL7, and the select gate lines SGDa to SGDd from a lower layer are alternately stacked on the interconnect layer 32.

For example, $SiO_2$ is used for the insulating layers 33. The interconnect layers 34 are made of a conductive material, and for example, an n-type semiconductor, a p-type semiconductor, or a metal material is used.

Hereinafter, a description will be given of a case where a stacked structure of titanium nitride (TiN)/tungsten (W) is used as the interconnect layer 34. For example, when W is deposited by chemical vapor deposition (CVD), TiN has a function as a barrier layer to prevent a reaction between W and $SfO_2$ or as an adhesion layer to improve the adhesion of W.

The memory pillars MP are formed to penetrate through the fourteen insulating layers 33 and the thirteen interconnect layers 34 to reach the interconnect layer 32. One memory pillar MP corresponds to one NAND string NS. A memory pillar MP includes a block insulating film 35, a charge storage layer 36, a tunnel insulating film 37, a semiconductor layer 38, a core layer 39, and a cap layer 40.

More specifically, a hole corresponding to the memory pillar MP is formed to penetrate through the insulating layers 33 and the interconnect layers 34 so that a bottom surface thereof reaches the interconnect layer 32. The block insulating film 35, the charge storage layer 36, and the tunnel insulating film 37 are sequentially stacked on a side surface of the hole. The semiconductor layer 38 is formed such that a side surface thereof is in contact with the tunnel insulating film 37 and a bottom surface thereof is in contact with the interconnect layer 32. The semiconductor layer 38 is an area where channels of the memory cell transistors MC and the select transistors ST1 and ST2 are formed. Thus, the semiconductor layer 38 functions as a signal line coupling current paths of the select transistor ST2, the memory cell transistors MC0 to MC7, and the select transistors ST1a to ST1d. The core layer 39 is provided in the semiconductor layer 38. The cap layer 40 whose side surface is in contact with the tunnel insulating film 37 is formed on the semiconductor layer 38 and the core layer 39. A contact plug (not illustrated) is formed on the cap layer 40. An interconnect layer functioning as the bit line BL is formed on the contact plug.

For example, SiO$_2$ is used for the block insulating film 35, the tunnel insulating film 37, and the core layer 39. For example, a silicon nitride film (SiN) is used for the charge storage layer 36. For example, polysilicon is used for the semiconductor layer 38 and the cap layer 40.

The slits SHE are formed to separate the four interconnect layers 34 functioning as the select gate lines SGDa to SGDd for each of the string units SU. The inside of the slit SHE is filled with an insulating layer 41. In addition, the slit SLT extending in the X direction is formed so as to separate the thirteen interconnect layers 34 for each of the blocks BLK. The inside of the slit SLT is filled with an insulating layer 42. For example, SiO$_2$ is used for the insulating layers 41 and 42.

The memory cell transistors MC0 to MC7 are constituted by the memory pillars MP and the eight interconnect layers 34 functioning as the word lines WL0 to WL7, respectively. Similarly, the select transistors ST1a to ST1d and ST2 are constituted by the memory pillars MP and the five interconnect layers 34 functioning as the select gate lines SGDa to SGDd and SGS, respectively.

Next, the terrace of the select gate line SGD1a of the string unit SU1 and the terrace of the select gate line SGD2a of the string unit SU2 will be described.

As illustrated in FIG. 6, the select gate lines SGD1b to SGD1d are not formed above the terrace of the select gate line SGD1a. Similarly, the select gate lines SGD2b to SGD2d are not formed above the terrace of the select gate line SGD2a. The terraces of the select gate lines SGD1a and SGD2a are separated from each other by the insulating layer 41 (the slit SHE), and further, are separated from the extraction electrodes HE of the select gate lines SGD0a to SGD0d and SGD3a to SGD3d by the insulating layers 41 (the slits SHE). Conductive layers 43 functioning as the contact plugs CC are formed on the terraces of the select gate lines SGD1a and SGD2a, respectively. A conductive layer 43 is made of a conductive material, and for example, a metal material such as tungsten (W) and titanium nitride (TiN) may be used.

Next, the terrace of the select gate line SGD0a of the string unit SU0 and the terrace of the select gate line SGD3a of the string unit SU3 will be described.

As illustrated in FIG. 7, the select gate lines SGD0b to SGD0d are not formed above the terrace of the select gate line SGD0a. Similarly, the select gate lines SGD3b to SGD3d are not formed above the terrace of the select gate line SGD3a. The terraces of the select gate lines SGD0a and SGD3a are separated from each other by the insulating layers 41 (the slits SHE). Further, the conductive layers 43 functioning as the contact plugs CC are formed on the terraces of the select gate lines SGD0a and SGD3a.

Next, a description will be given of a part of a cross-sectional configuration of the staircase connecting portion in the X direction.

As illustrated in FIG. 8, the terraces of the select gate lines SGD1d, SGD1c, SGD1b, and SGD1a of the string unit SU1 and the terraces of the select gate lines SGD0a, SGD0b, SGD0c, and SGD0d of the string unit SU0 are arranged along the X direction from the cell portion to the staircase connecting portion. The conductive layers 43 functioning as the contact plugs CC are formed on the terraces.

Figure 9:
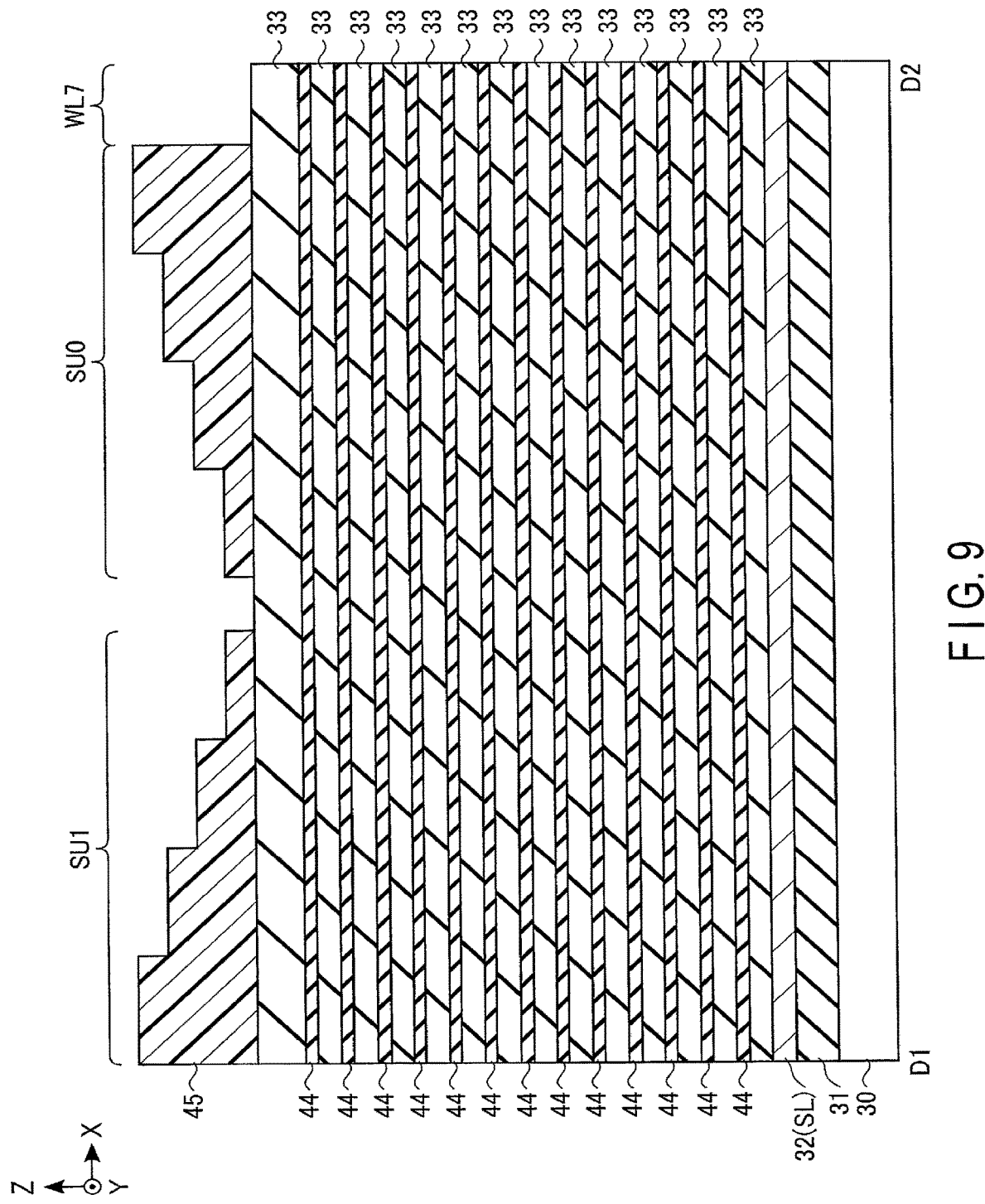
FIGS. 9 to 11 illustrate a manufacturing process of the select gate lines SGD in a staircase connecting portion of the memory cell array included in the semiconductor memory device according to the first embodiment.
Figure 10:
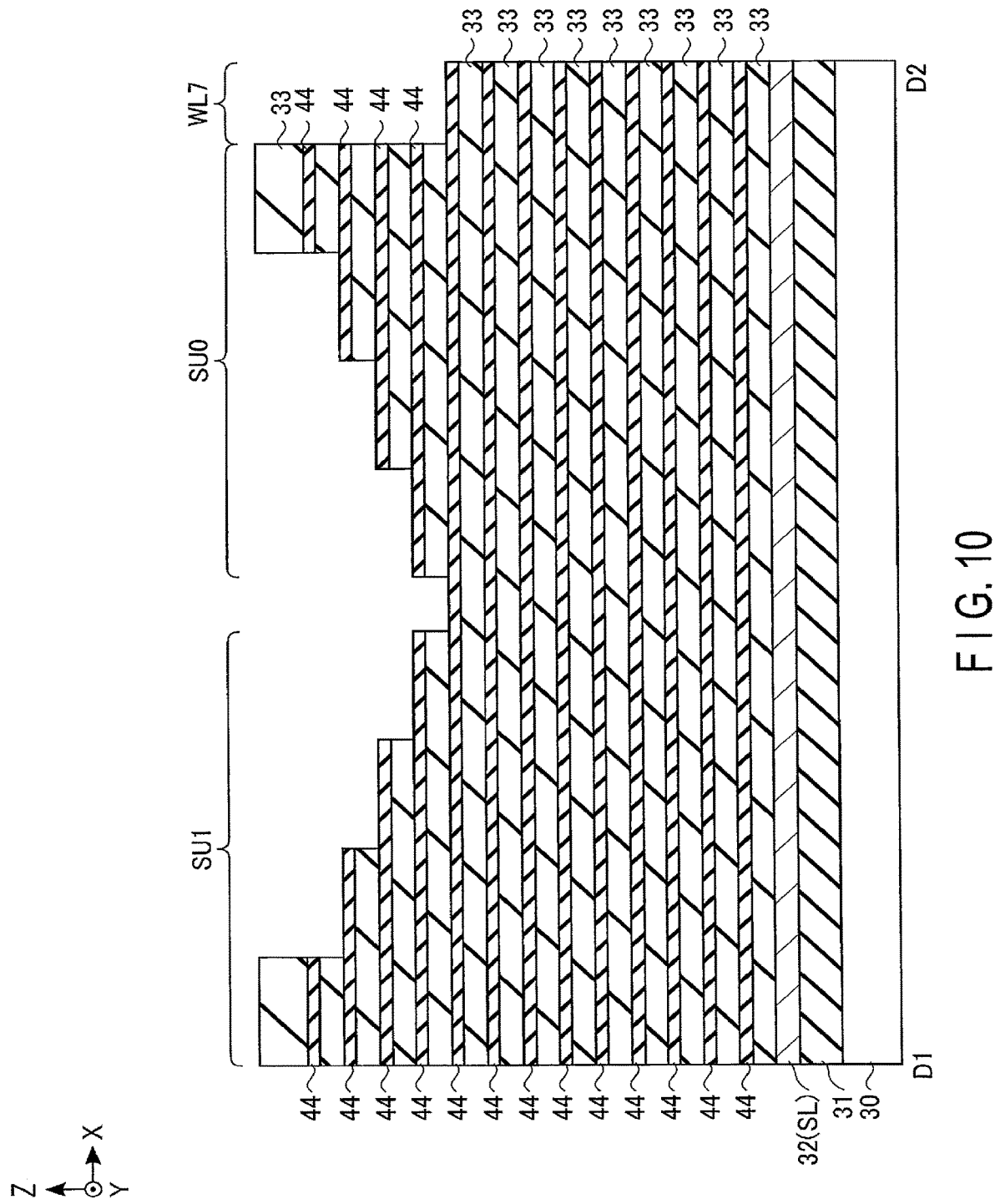
Figure 11:
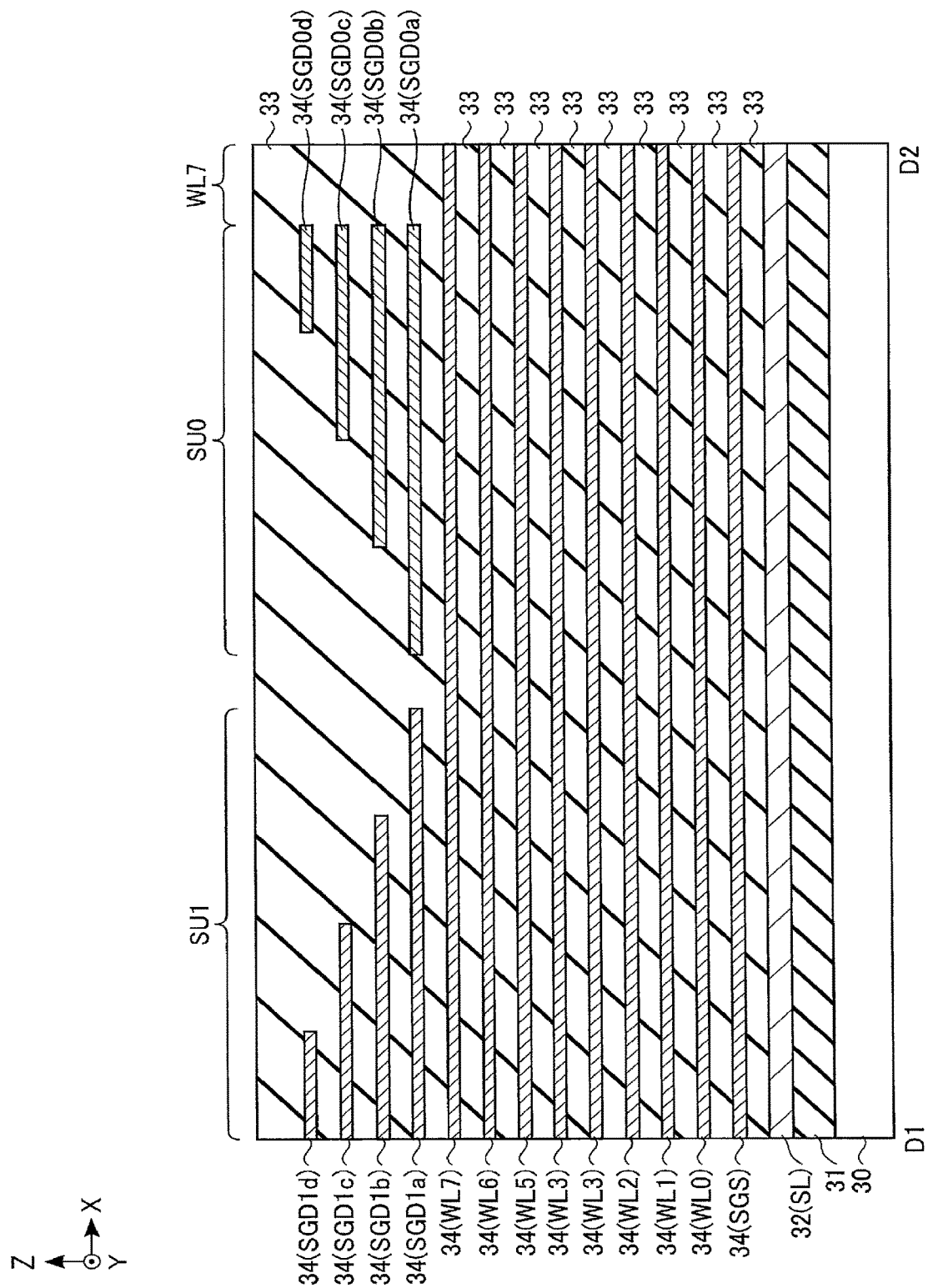

1.2 Method of Forming Terrace of Select Gate Line SGD in Staircase connecting Portion Next, a method of forming the terrace of the select gate line SGD in the staircase connecting portion will be described with reference to FIGS. 9 to 11. FIGS. 9 to 11 illustrate cross sections taken along the line D1-D2 in FIG. 3. In the present embodiment, a case where the interconnect layers 34 are formed by the replacement will be described. Hereinafter, processing of sacrificial layers corresponding to the select gate lines SGD will be described, and a description regarding processing of sacrificial layers corresponding to the word lines WL and the select gate lines SGS will be omitted in order to simplify the description.

As illustrated in FIG. 9, the fourteen insulating layers 33 and thirteen sacrificial layers 44 corresponding to the thirteen interconnect layers 34 are alternately stacked on the interconnect layer 32. For example, SiN is used for the sacrificial layers. Incidentally, the sacrificial layers are not limited to SiN. The sacrificial layers 44 are preferably made of, for example, a material that has a sufficient selection ratio with the insulating layer 33 against wet etching.

Next, a template transfer layer 45 is formed on the uppermost insulating layer 33 using a nanoimprint lithography technique. For the template transfer layer 45, for example, an ultraviolet curable resin is used. The template transfer layer 45 functions as a mask pattern during processing of the insulating layers 33 and the sacrificial layers 44. The template transfer layer 45 has a staircase shape having four steps in order to process the four sacrificial layers 44 corresponding to the select gate lines SGDa to SGDd into the staircase shape having four steps. More specifically, the first step from the bottom of the template transfer layer 45 corresponds to the select gate line SGDa. Accordingly, the upper three sacrificial layers 44 are processed during processing of the four sacrificial layers 44. The second step from the bottom corresponds to the select gate line SGDb. Accordingly, the upper two sacrificial layers 44 are processed during processing of the four sacrificial layers 44. The third step from the bottom corresponds to the select gate line SGDc. Accordingly, the uppermost sacrificial layer 44 is processed during processing of the four sacrificial layers 44. The uppermost step corresponds to the select gate line SGDd. Accordingly, the uppermost sacrificial layer 44 is prevented from being processed during processing of the four sacrificial layers 44.

Next, the upper four sacrificial layers 44 are processed as illustrated in FIG. 10. During this, the four sacrificial layers 44 are processed into the staircase shape having four steps corresponding to the select gate lines SGDa to SGDd in the staircase connecting portion by the template transfer layer 45.

Incidentally, the case where the four sacrificial layers 44 corresponding to the select gate lines SGDa to SGDd are processed to have the staircase shape having four steps using the nanoimprint lithography technique has been described in the examples of FIGS. 9 and 10, but a method of processing the sacrificial layers 44 is not limited thereto. For example, a mask pattern of resist may be formed using a photolithography technique so as to process the four sacrificial layers 44. In this case, exposure and processing may be repeated four times correspondingly to the select gate lines SGDa to SGDd, or the four sacrificial layers 44 may be processed into the staircase shape having four steps by changing a size of a mask pattern by slimming.

As illustrated in FIG. 11, the sacrificial layers 44 corresponding to the word lines WL and the select gate line SGS are also processed into a staircase shape, and then, the insulating layer 33 is formed on the sacrificial layer 44, and the surface is planarized by, for example, chemical mechanical polishing (CMP) or the like. Further, thirteen sacrificial layers 44 are replaced with the interconnect layers 34 by the replacement. More specifically, the dummy pillars HR are formed, and then, trench patterns of the slits SLT are formed such that the thirteen sacrificial layers 44 are exposed at side surfaces of the slits SLT. Next, the sacrificial layers 44 are removed from the side surfaces of the slit SLT by wet etching to form a void. Next, for example, TiN and W are formed to fill the void, and then, TiN and W in the slit SLT and on the uppermost insulating layer 33 are removed. Next, the slit SLT is filled with the insulating layer 42.

After the replacement, the conductive layers 43 are formed as illustrated in FIG. 8.

1.3 Advantageous Effects According to Present Embodiment

With the configuration according to the present embodiment, it is possible to improve the reliability. This advantageous effect will be described in detail.

For example, when the single block BLK, that is, four string units SU are arranged between the two slits SLT, the select gate lines SGD of the four string units SU are separated from each other by the slits SHE. For example, there is a case where the terraces of the select gate lines SGD of the four string units SU are arranged in four rows in the X direction in accordance with the arrangement of the string units SU in the four string units SU adjacent in the Y direction. In this case, when an interval between the slits SLT in the Y direction is reduced, a length in the Y direction of the terrace of each of the select gate lines SGD is decreased. As the length of the terrace is decreased, there is a high possibility that a connecting failure caused by misalignment between the terrace (the select gate line SGD) and the contact plug CC due to manufacturing variations or a withstand voltage failure caused by a decreased distance between the contact plug CC and another select gate line SGD that is adjacent in the Y direction and not to be connected to the contact plug may occur. In addition, it is difficult to secure a sufficient arrangement space for the dummy pillars HR on the terrace.

With the configuration according to the present embodiment, however, the terraces of the select gate lines SGD of the four string units SU can be arranged in two rows in the X direction in the four string units SU adjacent in the Y direction. That is, the terraces of the two select gate lines SGD adjacent in the Y direction can be arranged in one row along the X direction. As a result, even when the interval between the slits SLT in the Y direction is reduced, it is possible to suppress the decrease of the length in the Y direction of the terrace of each of the select gate lines SGD by adjusting a length in the Y direction of the extraction electrode HE. Accordingly, the connection failure and the withstand voltage failure between the select gate line SGD and the contact plug CC can be suppressed, and the reliability of the semiconductor memory device can be improved.

Furthermore, since the arrangement space for the dummy pillars HR in the terrace of the select gate line SGD can be secured, it is possible to suppress a formation failure during formation of the interconnect layers by the replacement.

2. Second Embodiment

Next, a second embodiment will be described. In the second embodiment, an arrangement of terraces of select gate lines SGD different from the terrace arrangement of the first embodiment will be described. Hereinafter, different points from the first embodiment will be mainly described.

Figure 12:
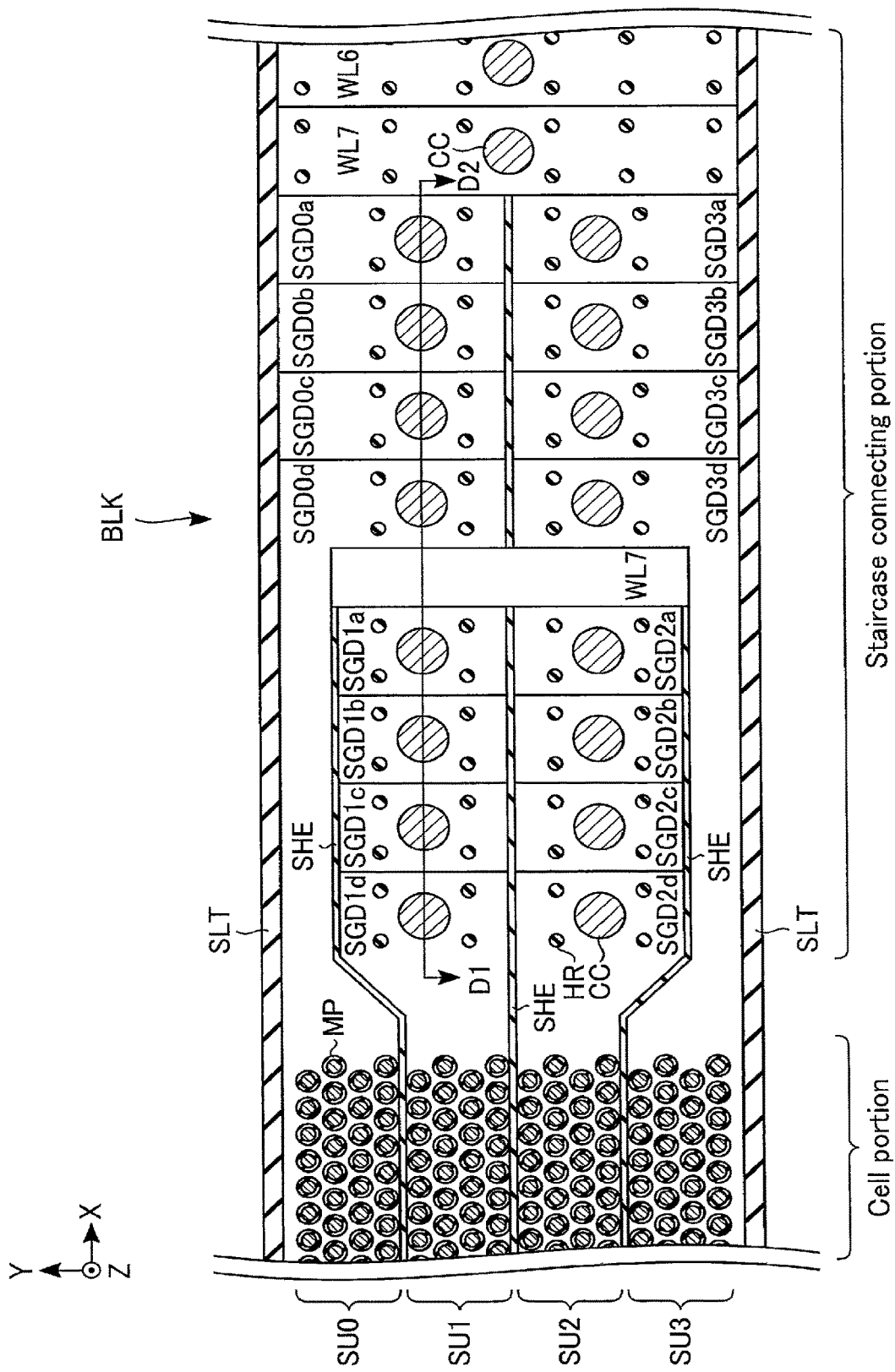
FIG. 12 is a plan view of a memory cell array included in a semiconductor memory device according to a second embodiment.

2.1 Planar Configuration of Memory Cell Array A planar configuration of a memory cell array 11 according to the present embodiment will be described with reference to FIGS. 12 and 13. FIG. 12 is a plan view of string units SU0 to SU3 in one block BLK.

Incidentally, interlayer insulating films are omitted in the example of FIG. 12. FIG. 13 is a plan view of layers of select gate lines SGDa to SGDd.

In the present embodiment, a plurality of terraces corresponding to select gate lines SGD1$d$ to SGD1$a$ of the string unit SU1 and a plurality of terraces corresponding to select gate lines SGD0$d$ to SGD0$a$ of the string unit SU0 are arranged in a row in an X direction from a cell portion to a staircase connecting portion as illustrated in FIG. 12. Similarly, a plurality of terraces corresponding to select gate lines SGD2$d$ to SGD2$a$ of the string unit SU2 and a plurality of terraces corresponding to select gate lines SGD3$d$ to SGD3$a$ of the string unit SU3 are arranged in a row in the X direction from the cell portion to the staircase connecting portion. The remaining points of the configuration are the same as those in FIG. 3 of the first embodiment.

Next, details of a planar configuration of layers of the select gate lines SGDa to SGDd will be described.

Figure 13:
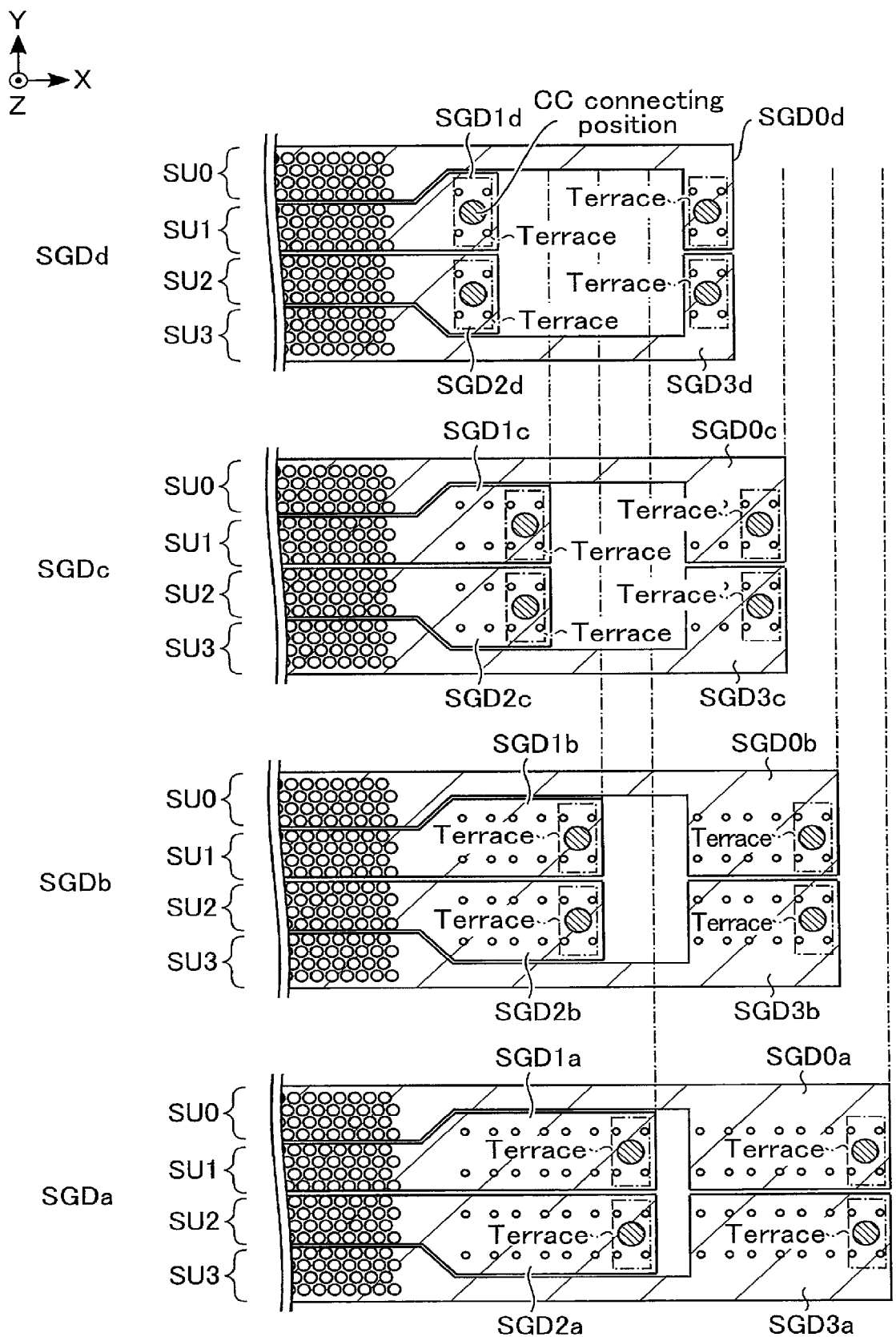
FIG. 13 is a plan view of select gate lines SGD in the memory cell array included in the semiconductor memory device according to the second embodiment.

As illustrated in FIG. 13, when first focusing on the select gate line SGDd, the terraces of the select gate lines SGD0$d$ and SGD3$d$ are arranged at positions farther from the cell portion than the terraces of the select gate lines SGD1$d$ and SGD2$d$.

Next, when focusing on the select gate line SGDc, the terraces of the select gate lines SGD0$c$ and SGD2$c$ are arranged at positions farther from the cell portion than the terraces of the select gate lines SGD1$d$ and SGD2$d$ so as to form a staircase shape with the terraces of the select gate lines SGD1$d$ and SGD2$d$ provided thereabove. The terraces of the select gate lines SGD0$c$ and SGD3$c$ are arranged at positions farther from the cell portion than the terraces of the select gate lines SGD1$c$ and SGD2$c$. In addition, the terraces of the select gate lines SGD0$c$ and SGD3$c$ are arranged at positions farther from the cell portion than the terraces of the select gate lines SGD0$d$ and SGD3$d$ so as to form a staircase shape with the terraces of the select gate lines SGD0$d$ and SGD3$d$ provided thereabove.

Next, when focusing on the select gate line SGDb, the terraces of the select gate lines SGD1$b$ and SGD2$b$ are arranged at positions farther from the cell portion than the terraces of the select gate lines SGD1$c$ and SGD2$c$ so as to form a staircase shape with the terraces of the select gate lines SGD1$c$ and SGD2$c$ provided thereabove. The terraces of the select gate lines SGD0$b$ and SGD3$b$ are arranged at positions farther from the cell portion than the terraces of the select gate lines SGD1$b$ and SGD2$b$. In addition, the terraces of the select gate lines SGD0$b$ and SGD3$b$ are arranged at positions farther from the cell portion than the terraces of the select gate lines SGD0c and SGD3c so as to form a staircase shape with the terraces of the select gate lines SGD0c and SGD3c provided thereabove.

Next, when focusing on the select gate line SGDa, the terraces of the select gate lines SGD1a and SGD2a are arranged at positions farther from the cell portion than the terraces of the select gate lines SGD1b and SGD2b so as to form a staircase shape with the terraces of the select gate lines SGD1b and SGD2b provided thereabove. The terraces of the select gate lines SGD0a and SGD3a are arranged at positions farther from the cell portion than the terraces of the select gate lines SGD1a and SGD2a. In addition, the terraces of the select gate lines SGD0a and SGD3a are arranged at positions farther from the cell portion than the terraces of the select gate lines SGD0b and SGD3b so as to form a staircase shape with the terraces of the select gate lines SGD0b and SGD3b provided thereabove.

2.2 Cross-Sectional Configuration of Memory Cell Array

Figure 14:
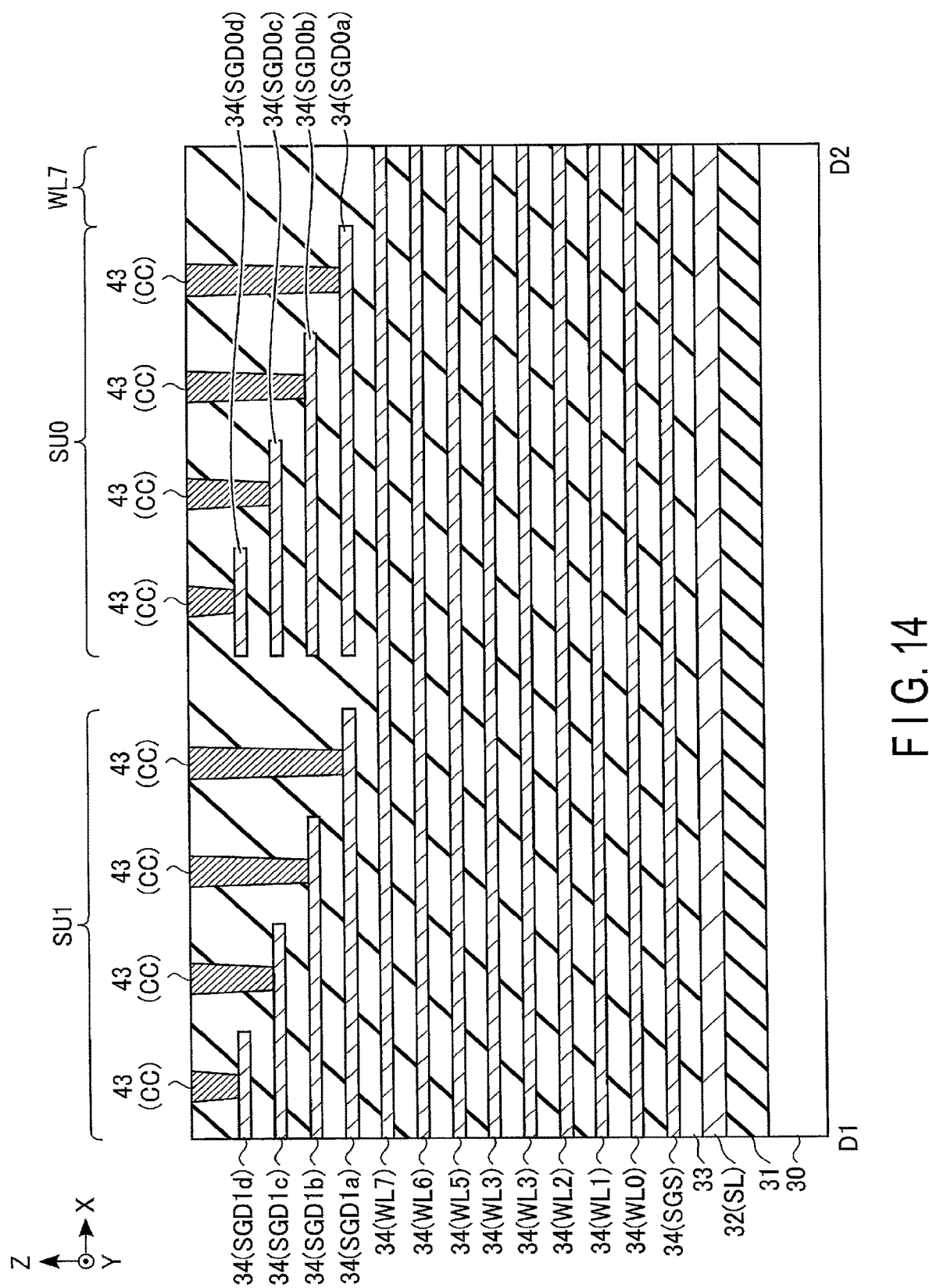
FIG. 14 is a cross-sectional view taken along a line D1-D2 of FIG. 12.

Next, a cross-sectional configuration of the memory cell array 11 will be described with reference to FIG. 14. FIG. 14 is a cross-sectional view taken along a line D1-D2 of FIG. 12.

As illustrated in FIG. 14, the terraces of the select gate lines SGD1d, SGD1c, SGD1b, and SGD1a of the string unit SU1 and the terraces of the select gate lines SGD0d, SGD0c, SGD0b, and SGD0a of the string unit SU0 are arranged along the X direction and from the cell portion to the staircase connecting portion. A conductive layer 43 is formed on each of the terraces.

2.3 Advantageous Effects of Present Embodiment With the configuration according to the present embodiment, the same advantageous effects as those of the first embodiment can be obtained.

3. Exemplary Modifications, Etc

According to the configuration of the above-described embodiments, a semiconductor memory device includes: a plurality of first interconnect layers (WL) above a substrate (30) at intervals in a first direction (Z direction); a second interconnect layer (SGD0a) above the first interconnect layers (WL), the second interconnect layer (SGD0a) being separate from the first interconnect layers (WL); a third interconnect layer (SGD1a) above the first interconnect layers (WL), the third interconnect layer (SGD1a) being separate from the first interconnect layers (WL) and adjacent to the second interconnect layer (SGD0a) in a second direction (Y direction) which is parallel to the substrate (30) and intersects the first direction (Z direction); a first memory pillar (MP) which passes through the first interconnect layers (WL) and the second interconnect layer (SGD0a) and extends in the first direction (Z direction); a second memory pillar (MP) which passes through the first interconnect layers (WL) and the third interconnect layer (SGD1a) and extends in the first direction (Z direction); a first contact plug (CC) on the second interconnect layer (SGD0a); and a second contact plug (CC) on the third interconnect layer (SGD1a). The second interconnect layer (SGD0a) includes a first portion connected to the first contact plug. The third interconnect layer (SGD1a) includes a second portion connected to the second contact plug. The first portion and the second portion are arranged along a third direction (X direction) which intersects the first and second directions.

When the above-described embodiments are applied, a semiconductor memory device whose reliability can be improved can be provided.

Incidentally, embodiments are not limited to the above-described embodiments, and various modifications can be made.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first interconnect layers above a substrate at intervals in a first direction;
a second interconnect layer above the first interconnect layers, the second interconnect layer being separate from the first interconnect layers;
a third interconnect layer above the first interconnect layers, the third interconnect layer being separate from the first interconnect layers and adjacent to the second interconnect layer in a second direction which is parallel to the substrate and intersects the first direction;
a first memory pillar which passes through the first interconnect layers and the second interconnect layer and extends in the first direction;
a second memory pillar which passes through the first interconnect layers and the third interconnect layer and extends in the first direction;
a first contact plug on the second interconnect layer; and
a second contact plug on the third interconnect layer, wherein
the second interconnect layer includes a first portion connected to the first contact plug,
the third interconnect layer includes a second portion connected to the second contact plug, and
the first portion and the second portion are arranged along a third direction which intersects the first and second directions.

2. The device according to claim 1, further comprising:
a fourth interconnect layer above the second interconnect layer, the fourth interconnect being separate from the first interconnect layers and the second interconnect layer in the first direction, and the first memory pillar further passing through the fourth interconnect layer;
a fifth interconnect layer above the third interconnect layer, the fifth interconnect layer being separate from the first interconnect layers and the third interconnect layer in the first direction and adjacent to the fourth interconnect layer in the second direction, and the second memory pillar further passing through the fifth interconnect layer;
a third contact plug on the fourth interconnect layer; and
a fourth contact plug on the fifth interconnect layer, wherein
the fourth interconnect layer includes a third portion connected to the third contact plug,
the fifth interconnect layer includes a fourth portion connected to the fourth contact plug, and
the first to fourth portions are arranged along the third direction.

3. The device according to claim 2 wherein:
the first to fourth portions are arranged in an order of the fourth portion, the second portion, the first portion, and the third portion along the third direction.

4. The device according to claim 2 wherein
the first to fourth portions are arranged in an order of the fourth portion, the second portion, the third portion, and the first portion along the third direction.

5. The device according to claim 1, further comprising:
a sixth interconnect layer above the first interconnect layers, the sixth interconnect layer being separate from the first interconnect layers and adjacent to the third interconnect layer in the second direction;
a seventh interconnect layer above the first interconnect layers, the seventh interconnect being separate from the first interconnect layers and adjacent to the sixth interconnect layer in the second direction;
a third memory pillar which passes through the first interconnect layers and the sixth interconnect layer and extends in the first direction;
a fourth memory pillar which passes through the first interconnect layers and the seventh interconnect layer and extends in the first direction;
a fifth contact plug on the sixth interconnect layer; and
a sixth contact plug on the seventh interconnect layer, wherein
the sixth interconnect layer includes a fifth portion connected to the fifth contact plug,
the seventh interconnect layer includes a sixth portion connected to the sixth contact plug,
the fifth portion is adjacent to the second portion in the second direction,
the sixth portion is adjacent to the first portion in the second direction, and
the fifth portion and the sixth portion are arranged along the third direction.

6. The device according to claim 5, further comprising:
an eighth interconnect layer above the sixth interconnect layer, the eighth interconnect layer being separate from the first interconnect layers and the sixth interconnect layer in the first direction, and the third memory pillar further passing through the eighth interconnect layer;
a ninth interconnect layer above the seventh interconnect layer, the ninth interconnect layer being separate from the first interconnect layers and the seventh interconnect layer in the first direction and adjacent to the eighth interconnect layer in the second direction, and the fourth memory pillar further passing through the ninth interconnect layer;
a seventh contact plug on the eighth interconnect layer; and
an eighth contact plug on the ninth interconnect layer, wherein
the eighth interconnect layer includes a seventh portion connected to the seventh contact plug,
the ninth interconnect layer includes an eighth portion connected to the eighth contact plug, and
the fifth to eighth portions are arranged along the third direction.

7. The device according to claim 1 wherein:
a length in the second direction of the third interconnect layer in a portion through which the second memory pillar passes is shorter than a length in the second direction of the second portion.

8. The device according to claim 1 wherein:
the second interconnect layer further includes:
a portion through which the first memory pillar passes; and
a first electrode portion which extends in the third direction and electrically couples the portion through which the first memory pillar passes and the first portion.

9. The device according to claim 8 wherein:
the first electrode portion is adjacent to the second portion in the second direction.

10. The device according to claim 8 wherein:
a length in the second direction of the portion through which the first memory pillar passes is longer than a length in the second direction of the first electrode portion.

11. The device according to claim 9, further comprising:
a first insulating layer which is continuously arranged between the portion of the second interconnect layer through which the first memory pillar passes and a portion of the third interconnect layer through which the second memory pillar passes and between the first electrode portion of the second interconnect layer and the second portion of the third interconnect layer, and has a crank shape.

12. The device according to claim 2 wherein:
the second interconnect layer further includes:
a portion through which the first memory pillar passes; and
a first electrode portion which extends in the third direction and electrically couples the portion through which the first memory pillar passes and the first portion, and
the fourth interconnect layer further includes:
a portion through which the first memory pillar passes; and
a second electrode portion which extends in the third direction and electrically couples the portion through which the first memory pillar passes and the third portion.

13. The device according to claim 12 wherein:
a position of the first electrode portion in the second direction and a position of the second electrode portion in the second direction are equal to each other.

14. The device according to claim 5 wherein:
the seventh interconnect layer further includes:
a portion through which the fourth memory pillar passes; and
a third electrode portion which extends in the third direction and electrically couples the portion through which the fourth memory pillar passes and the sixth portion.

15. The device according to claim 14 wherein:
the third electrode portion is adjacent to the fifth portion in the second direction.

16. The device according to claim 15, further comprising:
a second insulating layer which is continuously arranged between a portion of the sixth interconnect layer through which the third memory pillar passes and the portion of the seventh interconnect layer through which the fourth memory pillar passes and between the fifth portion of the sixth interconnect layer and the third electrode portion of the seventh interconnect layer, and has a crank shape.

17. The device according to claim 16, further comprising:
a third insulating layer which is continuously arranged between the portion of the sixth interconnect layer through which the third memory pillar passes and a portion of the third interconnect layer through which the second memory pillar passes and between the fifth portion of the sixth interconnect layer and the second portion of the third interconnect layer, and linearly extends in the third direction.

18. The device according to claim 5 wherein:
the first interconnect layers are separate for each block by a plurality of slits which extend in the third direction and are arranged in the second direction, and
the second interconnect layer, the third interconnect layer, the sixth interconnect layer, and the seventh interconnect layer are arranged in the second direction above the first interconnect layers in an area between two slits adjacent in the second direction.

19. The device according to claim 2 wherein
the first to fourth contact plugs are arranged along the third direction.

20. A semiconductor memory device comprising:
a plurality of first interconnect layers above a substrate at intervals in a first direction;
a second interconnect layer above the first interconnect layers, the second interconnect being separate from the first interconnect layers;
a third interconnect layer above the first interconnect layers, the third interconnect layer being separate from the first interconnect layers and adjacent to the second interconnect layer in a second direction which is orthogonal to the first direction;
a first memory pillar which passes through the first interconnect layers and the second interconnect layer and extends in the first direction;
a second memory pillar which passes through the first interconnect layers and the third interconnect layer and extends in the first direction;
a first contact plug on the second interconnect layer; and
a second contact plug on the third interconnect layer, wherein
the second interconnect layer includes a first terrace connected to the first contact plug,
the third interconnect layer includes a second terrace connected to the second contact plug, and
a portion of the second terrace of the third interconnect layer is arranged between a portion of the third interconnect layer through which the second memory pillar passes and the first terrace of the second interconnect layer in a third direction orthogonal to the first direction and the second direction, and
another portion of the second terrace of the third interconnect layer is arranged between a portion of the second interconnect layer through which the first memory pillar passes and the first terrace of the second interconnect layer in the third direction.

* * * * *